(12) United States Patent
Cheng et al.

(10) Patent No.: US 9,324,735 B2
(45) Date of Patent: Apr. 26, 2016

(54) ARRAY SUBSTRATE AND MANUFACTURING METHOD THEREOF, DISPLAY PANEL AND DISPLAY DEVICE

(71) Applicant: BOE Technology Group Co., Ltd., Beijing (CN)

(72) Inventors: Jun Cheng, Beijing (CN); Haijing Chen, Beijing (CN); Chunsheng Jiang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 133 days.

(21) Appl. No.: 14/348,434

(22) PCT Filed: Dec. 16, 2013

(86) PCT No.: PCT/CN2013/089530
§ 371 (c)(1),
(2) Date: Mar. 28, 2014

(87) PCT Pub. No.: WO2014/206035
PCT Pub. Date: Dec. 31, 2014

(65) Prior Publication Data
US 2015/0318311 A1 Nov. 5, 2015

(30) Foreign Application Priority Data

Jun. 28, 2013 (CN) .......................... 2013 1 0269161

(51) Int. Cl.
*H01L 27/12* (2006.01)
*H01L 29/786* (2006.01)
(Continued)

(52) U.S. Cl.
CPC .......... *H01L 27/1225* (2013.01); *H01L 21/467* (2013.01); *H01L 27/124* (2013.01);
(Continued)

(58) Field of Classification Search
CPC .............. H01L 21/467; H01L 27/1225; H01L 29/42384
USPC ............................................................ 257/43
See application file for complete search history.

(56) References Cited

U.S. PATENT DOCUMENTS 5,273,920 A * 12/1993 Kwasnick ........... H01L 21/3003
148/DIG. 1
7,692,740 B2 4/2010 Doi et al.
(Continued)

FOREIGN PATENT DOCUMENTS

CN 101000896 A 7/2007
CN 101957529 A 1/2011
(Continued)

OTHER PUBLICATIONS

Notification of First Office Action and search report issued by Chinese Patent Office for priority application CN 201310269161.6 dated Sep. 30, 2014 with English translation of first office action.
(Continued)

*Primary Examiner* — Matthew W Such
*Assistant Examiner* — Warren H Kilpatrick
(74) *Attorney, Agent, or Firm* — Frommer Lawrence & Haug LLP

(57) ABSTRACT

The present invention provides an array substrate and a manufacturing method thereof, a display panel and a display device. The array substrate includes a plurality of pixel units, each of which includes: a TFT area provided with a TFT including a gate, a gate insulation layer, an active area, a source and a drain; and a display area provided with a pixel electrode.

2 Claims, 5 Drawing Sheets

(51) Int. Cl.
   *H01L 29/45*   (2006.01)
   *H01L 29/423*  (2006.01)
   *H01L 21/467*  (2006.01)
   *H01L 29/66*   (2006.01)

(52) U.S. Cl.
   CPC ...... *H01L27/1259* (2013.01); *H01L 29/42384* (2013.01); *H01L 29/45* (2013.01); *H01L 29/7869* (2013.01); *H01L 29/66969* (2013.01)

(56) References Cited

U.S. PATENT DOCUMENTS 8,143,093 B2 * 3/2012 Ye .................. H01L 29/7869
                                              257/43

| | | | |
|---|---|---|---|
| 2006/0285046 | A1 | 12/2006 | Yang et al. |
| 2011/0175088 | A1 | 7/2011 | Kim et al. |
| 2013/0302939 | A1 * | 11/2013 | Liu .......... H01L 29/66969 438/104 |

FOREIGN PATENT DOCUMENTS

CN   102651341 A  *  8/2012  ........ H01L 29/66969
CN   103354218 A      10/2013

OTHER PUBLICATIONS

International Search Report and Written Opinion issued by the Chinese Patent Office acting as the International Searching Authority for international application PCT/CN2013/089530 dated Mar. 20, 2014 with English translation of Written Opinion.

* cited by examiner

ARRAY SUBSTRATE AND MANUFACTURING METHOD THEREOF, DISPLAY PANEL AND DISPLAY DEVICE

This application is a 371 of PCT/CN2013/089530 filed on Dec. 16, 2013, which claims priority benefits from Chinese Patent Application Number 201310269161.6 filed Jun. 28, 2013, the disclosure of which is incorporated herein by reference.

FIELD OF THE INVENTION

The present invention relates to the field of display technology, and particularly, to an array substrate and a manufacturing method thereof, a display panel and a display device.

BACKGROUND OF THE INVENTION

In recent years, rapid progress has been made in display technology. For example, thin film transistor (TFT) technology has been developed from original a-Si (amorphous silicon) TFTs to current LTPS (low temperature polysilicon) TFTs, MILC (metal-induced lateral crystallization) TFTs, oxide TFTs, and the like. Also, illumination technology has been developed from original LCDs (liquid crystal displays) and PDPs (plasma display panels) to current OLED (organic light-emitting diodes) and the like.

Currently, the oxide TFT has aroused increasing attention due to its various advantages. A TFT in which oxide semiconductor is used as an active layer has high mobility, good uniformity, transparency and better switching characteristics, and may also be applied to applications requiring prompt response and large current, such as a display with high frequency, high resolution and large size, an OLED display, and the like.

However, manufacturing process of an oxide TFT array substrate in the prior art is relatively complicated, and generally includes six photolithographic processes. FIG. 1 illustrates a schematic diagram of a typical structure of an existing oxide TFT array substrate, in which the oxide TFT array substrate includes a substrate 1, a gate 2, a gate insulation layer 3, an oxide active layer 4, an etching stop area 5, a drain 602, a source 601, a passivation layer 7 and a pixel electrode 8. For the oxide TFT array substrate with such a structure, six photolithographic processes are required to respectively form patterns including the gate 2, the oxide active layer 4, the etching stop area 5, the source 601 and the drain 602, a via in the passivation layer 7 and the pixel electrode 8. Therefore, the oxide TFT array substrate with such a structure has complicated manufacturing process and relatively high manufacturing costs.

SUMMARY OF THE INVENTION

In view of the problems that the existing oxide TFT array substrate has complicated manufacturing process and relatively high manufacturing costs, the present invention provides a manufacturing method of an array substrate with simple manufacturing process and low manufacturing costs.

A technical solution employed by the present invention is a manufacturing method of an array substrate, the array substrate including a plurality of pixel units, each of which includes: a TFT area provided with a TFT including a gate, a gate insulation layer, an active area, a source and a drain; and a display area provided with a pixel electrode, and the manufacturing method of the array substrate includes steps of:

forming a pattern including the gate on a substrate through a patterning process, and forming the gate insulation layer;

forming patterns including the active area and an etching stop area provided on the active area through a patterning process, on the substrate subjected to the above step;

forming a transparent conductive layer film, and forming patterns including the source and the drain from the transparent conductive layer film through a patterning process; and forming a pattern including the pixel electrode from the transparent conductive layer film through a patterning process.

Preferably, the step of forming patterns including the active area and an etching stop area provided on the active area through a patterning process includes steps of:

sequentially forming an active layer film and an etching stop layer film, and applying a photoresist layer on the etching stop layer film, wherein, a portion of the active layer film corresponding to the gate constitutes the active area;

exposing and developing the photoresist layer to maintain a portion of the photoresist layer on the etching stop area;

removing a portion of the etching stop layer film which is not covered by the photoresist layer to form a pattern of the etching stop area; and removing the remaining photoresist layer.

Preferably, the step of forming a transparent conductive layer film and forming patterns including the source and the drain from the transparent conductive layer film through a patterning process includes steps of:

sequentially forming a transparent conductive layer film, a transition layer film and a metal layer film; and removing respective portions of the metal layer film, the transition layer film and the transparent conductive layer film corresponding to the active area and removing respective portions of the metal layer film, the transition layer film, the transparent conductive layer film and the active layer film between individual pixel units through a patterning process, so as to form patterns including a source connection layer, a source transition layer, the source and the drain, wherein, the source transition layer is used to electrically connect the source connection layer with the source.

Further preferably, the step of forming a pattern including the pixel electrode from the transparent conductive layer film through a patterning process includes steps of:

forming a passivation layer, and applying a photoresist layer on the passivation layer;

exposing and developing the photoresist layer, wherein no photoresist layer is left in the display area;

removing a portion of the passivation layer which is not covered by the photoresist layer in the display area through dry etching;

removing a portion of the metal layer film which is not covered by the photoresist layer in the display area through wet etching;

removing a portion of the transition layer film which is not covered by the photoresist layer in the display area through dry etching, so as to expose the transparent conductive layer film to form the pixel electrode; and removing the remaining photoresist layer.

With the manufacturing method of the array substrate of the present invention, the same transparent conductive layer film is used to form patterns including the source, the drain and the pixel electrode through patterning process, and therefore the manufacturing process is relatively simple and the manufacturing costs are relatively low.

In view of the problems that the existing oxide TFT array substrate has complicated manufacturing process and relatively high manufacturing costs, the present invention also provides an array substrate with simple manufacturing process and low manufacturing costs.

A technical solution employed by the present invention is an array substrate, including a plurality of pixel units, each of which includes: a TFT area provided with a TFT including a gate, a gate insulation layer, an active area, a source and a drain; and a display area provided with a pixel electrode, wherein the source, the drain and the pixel electrode are formed from the same transparent conductive layer.

Preferably, the array substrate further includes: a source transition layer disposed on the source and a source connection layer disposed on the source transition layer, wherein, the source transition layer is used to electrically connect the source connection layer with the source.

Further preferably, the source, the source transition layer and the source connection layer have the same patterns.

Further preferably, material of the source transition layer is heavily doped amorphous silicon; the source connection layer is a single layer or a multi-layer composite laminate formed of one or more materials selected from molybdenum, molybdenum-niobium alloy, aluminum, aluminum-neodymium alloy, titanium and copper.

Preferably, the array substrate further includes a passivation layer, and the passivation layer covers the TFT area.

Preferably, material of the active area is metal oxide semiconductor material.

Preferably, the array substrate further includes an etching stop area provided on the active area.

The array substrate of the present invention includes the TFT area and the display area, both of which include a transparent conductive layer. As the source, the drain and the pixel electrode of the array substrate of the present invention are formed from the same transparent conductive layer, the manufacturing process is relatively simple and the manufacturing costs are relatively low.

In view of the problems that the existing display panel including an oxide TFT array substrate has complicated manufacturing process and relatively high manufacturing costs, the present invention also provides a display panel with simple manufacturing process and low manufacturing costs.

A technical solution employed by the present invention is a display panel, which includes:

any of the above-described array substrates.

The array substrate of the display panel of the present invention includes the TFT area and the display area, both of which include a transparent conductive layer. As the source, the drain and the pixel electrode of the array substrate of the present invention are formed from the same transparent conductive layer, the manufacturing process is relatively simple and the manufacturing costs are relatively low.

In view of the problems that the existing display device including an oxide TFT array substrate has complicated manufacturing process and relatively high manufacturing costs, the present invention also provides a display device with simple manufacturing process and low manufacturing costs.

A technical solution employed by the present invention is a display device, which includes:

any of the above-described display panel.

The array substrate of the display device of the present invention includes the TFT area and the display area, both of which include a transparent conductive layer. As the source, the drain and the pixel electrode of the array substrate of the present invention are formed from the same transparent conductive layer, the manufacturing process is relatively simple and the manufacturing costs are relatively low.

Figure 1:
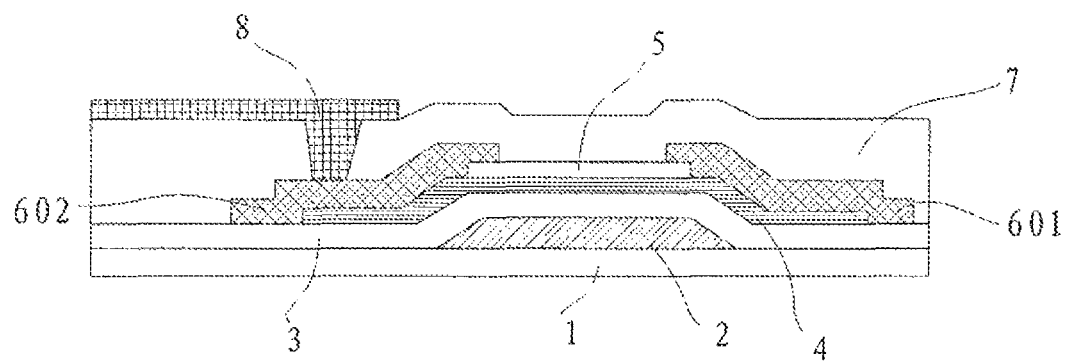
FIG. 1 is a schematic diagram of a structure of an oxide TFT array substrate in the prior art.

Herein, reference numerals are as follows: 1: substrate; 2: gate; 3: gate insulation layer; 4: active layer, 401: active area; 5: etching stop area; 601: source; 602: drain; 7: passivation layer; 8: pixel electrode; 9: source transition layer; 10: source connection layer; Q1: TFT area; Q2: display area.

DETAILED DESCRIPTION OF THE EMBODIMENTS

The present invention will be further described in detail below with reference to the accompanying drawings and specific implementations, for a better understanding of the technical solutions of the present invention by the skilled person in the art.

Embodiment 1

Figure 2:
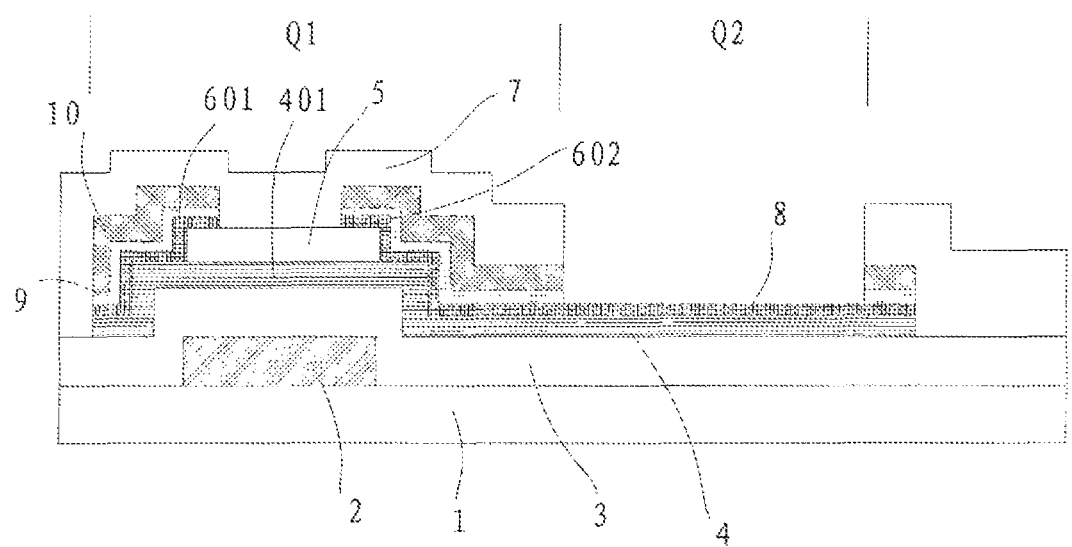
FIG. 2 is a schematic diagram of a structure of an array substrate according to Embodiment 1 of the present invention.
Figure 3:
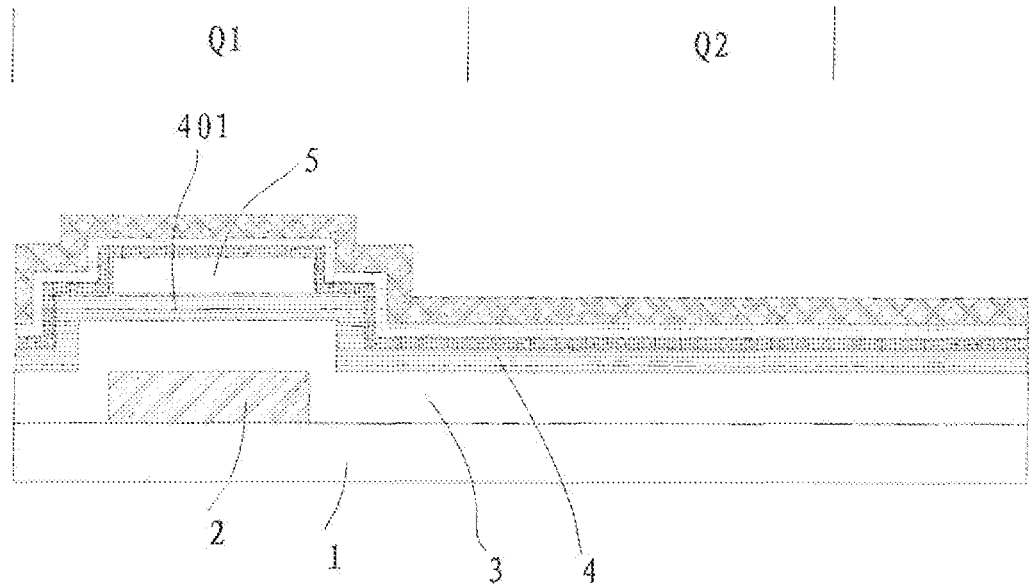
FIG. 3 is a schematic diagram of a structure of an array substrate according to Embodiment 2 of the present invention after being formed with patterns including a transparent conductive layer film, a transition layer film and a metal layer film.

As illustrated in FIG. 2, this embodiment provides an array substrate, which includes a TFT area Q1 and a display area Q2, and the TFT area Q1 is provided with a TFT including a gate 2, a gate insulation layer 3 and an active layer 4, wherein a portion of the active layer 4 corresponding to the gate 2 is an active area 401. Herein, the gate 2 is disposed on the substrate 1, the gate insulation layer 3 covers the gate 2, and the active layer 4 is disposed on the gate insulation layer 3.

Preferably, material of the active area 401 (i.e., material of the active layer 4) is metal oxide semiconductor material, such as Indium Gallium Zinc Oxide, Indium Zinc Oxide or Indium Gallium Tin Oxide, and preferably is Indium Gallium Zinc Oxide or Indium Zinc Oxide; the active layer 4 has a thickness preferably between 10 nm and 100 nm. It should be noted that, as illustrated in FIG. 2, for the purpose of simplifying the manufacturing process, the display area Q2 also has the active layer 4, that is, the active layer 4 may extend to the display area 2, and obviously, in this case, the active layer 4 should be transparent. Any metal oxide semiconductor material is transparent material, and thus is preferable.

The TFT area Q1 and the display area Q2 also include a transparent conductive layer (e.g. an Indium Tin Oxide layer), and the transparent conductive layer constitutes a source 601 and a drain 602 of the TFT in the TFT area Q1, and constitutes a pixel electrode 8 in the display area Q2. In other words, all of the source 601, the drain 602 and the pixel electrode 8 are formed from the same transparent conductive layer.

In the prior art, the source 601 and the drain 602 of the TFT are formed from a source-drain metal layer, while the pixel electrode 8 is formed from one transparent conductive layer, and generally, the pixel electrode 8 is electrically connected to the drain 602 through a via formed in a passivation layer 7 on the source-drain metal layer. In the array substrate of the present invention, the source 601, the drain 602 and the pixel electrode 8 are formed from the same transparent conductive layer, as illustrated in FIG. 2, the source 602 and the pixel electrode 8 are directly connected, and therefore, the array substrate of the present invention has simple manufacturing process and low manufacturing costs.

Preferably, the array substrate further includes a source connection layer 10.

It should be noted that the source connection layer 10 is configured to be electrically connected to a data line (not shown in figures). The source 601 is directly connected to the data line in the prior art, while in the array substrate provided by this embodiment, the source 601 is preferably electrically connected to the data line through the source connection layer 10. The source 601 in this embodiment is formed from the transparent conductive layer, and the data line is generally made of a metal material, and therefore a portion where the source 601 and the data line are connected has poor conductivity, which may cause data signals to be distorted to a large extent during a process of being transmitted to the pixel electrode 8. As a result, the array substrate provided by the present invention preferably includes the source connection layer 10. The source connection layer 10 preferably is a single layer or a multi-layer composite laminate formed of one or more materials selected from molybdenum, molybdenum-niobium alloy, aluminum, aluminum-neodymium alloy, titanium and copper.

Preferably, the array substrate provided by the present invention further includes a source transition layer 9.

It should be note that the source transition layer 9 is configured to electrically connect the source connection layer 10 with the source 601. The material of the source connection layer 10 is a metal or an alloy, the source 601 is formed from the transparent conductive layer, and therefore, if the source connection layer 10 is directly connected to the source 601 without the source transition layer 9, the problem of bad contact existing between the source connection layer 10 and the source 601 may still occur, resulting in that the data signals cannot be correctly transmitted to the pixel electrode 8 when connecting the source connection layer 10 to the data line, thus impacting the accuracy and stability of the voltage of the pixel electrode 8, and further impacting the display effect of the Liquid Crystal Display device. As a result, the source transition layer 9 is further provided between the source 601 and the source connection layer 10 on the array substrate of the present invention. The material of the source transition layer 9 is heavily doped amorphous silicon (N+a-Si), this material can guarantee a good electrical conductivity, and thus guarantee that data signals can be correctly transmitted to the pixel electrode 8.

Further preferably, the source transition layer 9 and the source connection layer 10 have the same pattern.

As illustrated in FIG. 2, the patterns of the source connection layer 10, the source transition layer 9 and the source 601 are the same, which is mainly for the sake of simplifying the manufacturing process (that is, these structures may be formed in a single patterning process). In fact, the patterns of the source connection layer 10, the source transition layer 9 and the source 601 may be different, and may be specifically designed according to specific requirements.

It should be further noted that in FIG. 2, there are also two layers on the drain 602, and these two layers are a transition layer film formed in the same layer as the source transition layer 9 and a metal layer film formed in the same layer as the source connection layer 10, respectively. These two layers have no effect on the performance of the TFT, and therefore may be maintained for the purpose of simplifying the process. Of course, these two layers may be removed in a certain manner.

The array substrate provided by this embodiment further preferably includes a passivation layer 7 covering both the TFT area Q1 and areas between individual pixel units. The passivation layer 7 is configured to protect the structure of the TFT. As illustrated in FIG. 2, the passivation layer 7 is provided on the TFT area Q1, but not provided on the pixel electrode 8 of the display area Q2. It should be understood that the pixel electrode 8 would form an electric field with a common electrode, and therefore the passivation layer 7 cannot be provided on the pixel electrode 8.

Preferably, the array substrate further includes an etching stop area 5 provided on the active area 401. It is easy to be understood that the etching stop area 5 is configured to ensure that the active area 401 is prevented from being etched when the transparent conductive layer film is etched.

It should be noted that the TFT of the array substrate provided by this embodiment is described by taking a bottom-gate type structure as an example. However, in fact, the technical solution mentioned in the present invention is also applicable to an array substrate including a TFT with a top-gate type structure, as long as the source 601, the drain 602 and the pixel electrode 8 are made from the same transparent conductive layer film.

It should be noted that the array substrate provided by the present invention takes the form that a common electrode is not included therein (that is, the common electrode is provided on a color film substrate) as an example, however, it is also feasible that the common electrode is provided on the array substrate (i.e., an IPS mode or ADS mode array substrate), as long as the source 601, the drain 602 and the pixel electrode 8 are made from the same transparent conductive layer film. In addition, the data line is not illustrated in the figures, but the data line is connected to the source connection layer 10, for example, through a via, or directly.

The array substrate of the present invention includes the TFT area Q1 and the display area Q2, and both the TFT area Q1 and the display area Q2 further include the transparent conductive layer. As the source 601, the drain 602 and the pixel electrode 8 of the array substrate of the present invention are made from the same transparent conductive layer film, the array substrate has simple manufacturing process and low manufacturing costs.

Embodiment 2

This embodiment provides a manufacturing method of an array substrate, and the array substrate includes a gate 2, a gate insulation layer 3, a source 601, a drain 602, a pixel electrode 8 and an active area 401. As illustrated in FIGS. 3 to 10, the manufacturing method of the array substrate of the present invention includes steps as below.

At S01, a pattern including the gate 2 is formed on the substrate 1 through a patterning process. The patterning process generally includes photoresist applying, exposing, developing, etching, photoresist removing, and other processes. Herein, the gate 2 is a single layer or a multi-layer composite laminate formed of one or more materials selected from molybdenum (Mo), molybdenum-niobium alloy (MoNb), aluminum (Al), aluminum-neodymium alloy (AlNd), titanium (Ti) and copper (Cu), and preferably is a single layer or a multi-layer composite laminate formed of molybdenum (Mo), aluminum (Al), or an alloy containing molybdenum (Mo) or aluminum (Al); preferably, the gate 2 has a thickness of 100 nm~3000 nm.

At S02, a pattern including the gate insulation layer 3 is formed on the substrate 1 subjected to the above step. Herein the gate insulation layer 3 is a single layer or a multi-layer composite film formed of one or two materials selected from silicon oxide ($SiO_x$), silicon nitride ($SiN_x$), hafnium oxide ($HfO_x$), silicon nitrogen oxide (SiON), aluminum oxide ($AlO_x$), and the like. The gate insulation layer 3 is preferably formed by Plasma Enhanced Chemical Vapor Deposition (PECVD) technique.

The above two steps may be designed according to different requirements, for example, may further include a step of forming a gate line (e.g., the gate line is formed at the same step as the gate 2) and the like, and the present invention is not limited thereto.

At S03, patterns including the active area 401 and an etching stop area 5 are formed on the substrate 1 subjected to the above steps through a patterning process.

Preferably, the step S03 specifically includes the steps as below.

At S031, an active layer film and an etching stop layer film are sequentially formed, and at the same time, a photoresist layer is formed on the etching stop layer film. Various methods such as depositing, coating, sputtering, and the like are generally adopted to form these films. Herein, a portion of the active layer film corresponding to the gate 2 is the active area 401, and a portion of the etching stop layer film corresponding to the active area 401 forms the etching stop area 5.

Herein, the active layer film is a metal oxide semiconductor film, such as Indium Gallium Zinc Oxide, Indium Zinc Oxide, Indium Gallium Tin Oxide, or the like.

The etching stop layer film may be a multi-layer composite laminate formed of silicon oxide ($SiO_x$), silicon nitride ($SiN_x$), hafnium oxide ($HfO_x$), aluminum oxide ($AlO_x$), or two or three materials thereof. The etching stop layer film contains low hydrogen content.

At S032, the photoresist layer is exposed and developed, and at the same time a portion of the photoresist layer corresponding to the etching stop area is maintained.

At S033, a portion of the etching stop layer film uncovered by the photoresist layer is removed, so as to form the pattern including the etching stop area 5.

It should be noted that the active layer 4 of the display area Q2 is maintained at this step to simplify the process. However, as a matter of fact, the portion of the active layer 4 in the display area Q2 has no actual function, and thus may be removed.

At S034, the remaining photoresist layer is removed.

At S04, a transparent conductive layer film is formed, and patterns including the source 601 and the drain 602 are formed from the transparent conductive layer film through a patterning process.

As illustrated in FIGS. 3 to 7, the step S04 preferably includes steps as below.

At S041, patterns respectively including a transparent conductive layer film, a transition layer film and a metal layer film are sequentially formed.

Herein, the transparent conductive layer film is preferably made of ITO (Indium Tin Oxide) material. Specifically, amorphous ITO (Indium Tin Oxide) film is first prepared by way of spluttering, and then is crystallized through annealing to form the transparent conductive layer film. The transparent conductive layer film has a thickness preferably of 20~150 nm.

The transition layer film is preferably made of heavily doped amorphous silicon (N+a-Si). Specifically, the transition layer film is formed by Plasma Enhanced Chemical Vapor Deposition technique at a deposition temperature below 350° C., and has a thickness of 100~500 Å, and preferably of 100~200 Å.

The metal layer film preferably is a single layer or a multi-layer composite laminate formed of one or more materials selected from molybdenum (Mo), molybdenum-niobium alloy (MoNb), aluminum (Al), aluminum-neodymium alloy (AlNd), Ti, Cr and Cu, and preferably is a single layer or a multi-layer composite laminate formed of Mo, Al, or an alloy containing Mo or Al; preferably, the metal layer film has a thickness of 100 nm~3000 nm.

At S042, respective portions of the metal layer film, the transition layer film and the transparent conductive layer film corresponding to the active area are removed through a patterning process, and respective portions of the metal layer film, the transition layer film, the transparent conductive layer film and the active layer film in areas between individual pixel units are removed, so as to form patterns including a source connection layer 10, a source transition layer 9, the source 601 and the drain 602.

Figure 4:
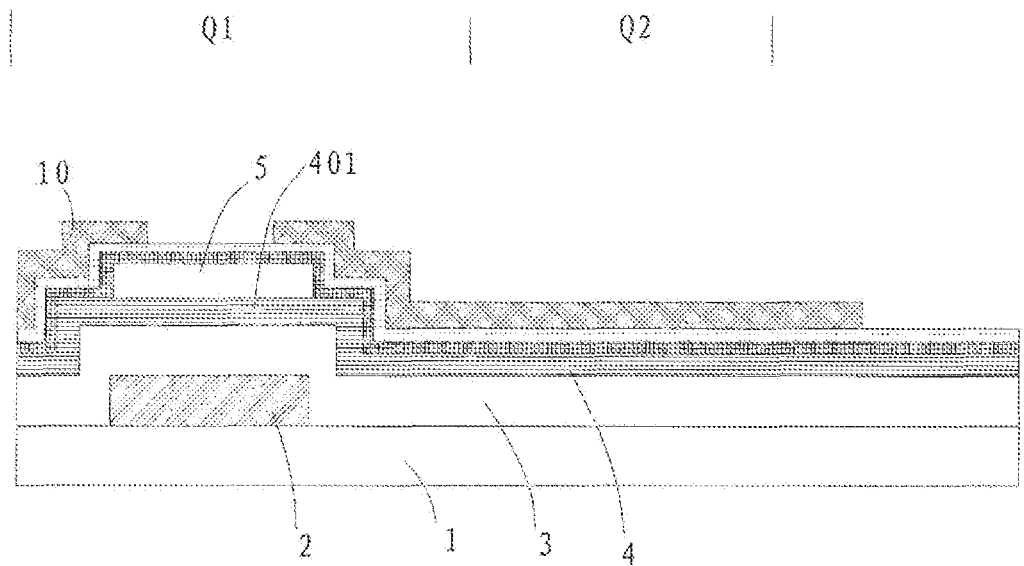
FIG. 4 is a schematic diagram of a structure of the array substrate according to Embodiment 2 of the present invention after being formed with a source connection layer.
Figure 5:
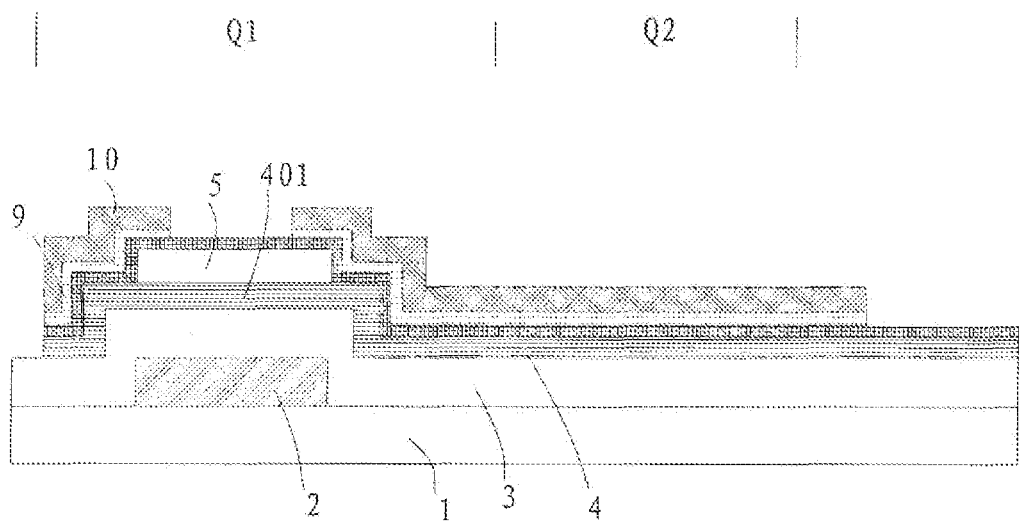
FIG. 5 is a schematic diagram of a structure of the array substrate according to Embodiment 2 of the present invention after being formed with a source transition layer.
Figure 6:
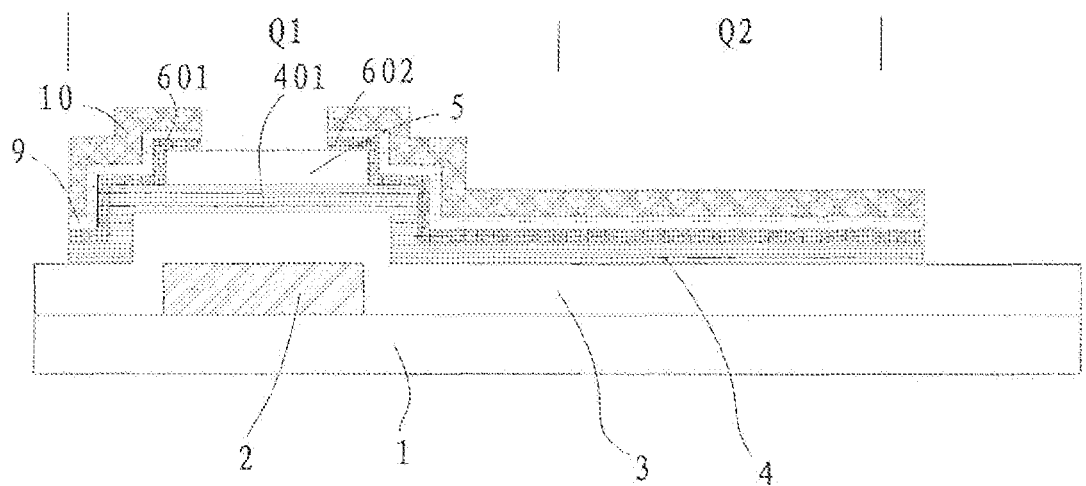
FIG. 6 is a schematic diagram of a structure of the array substrate according to Embodiment 2 of the present invention after being formed with a source and a drain.

It should be noted that, as illustrated in FIGS. 4 to 6, the step of removing respective portions of the metal layer film, the transition layer film, the transparent conductive layer film and the active layer film corresponding to the active area 401 is performed at the same time as the step of removing respective portions of the metal layer film, the transition layer film, the transparent conductive layer film and the active layer film in areas between individual pixel units. However, due to the fact that the etching stop area 5 is provided on the active areas 401, when removing the active layer film, only the portions of the active layer film in areas between individual pixel units are removed, and the portion of the active layer film in the active area is not etched away.

A method for removing respective portions of the metal layer film, the transition layer film and the transparent conductive layer film corresponding to the active area, and removing respective portions of the metal layer film, the transition layer film, the transparent conductive layer film and the active layer film in areas between individual pixel units preferably includes steps as below.

At S0421, as illustrated in FIG. 4, wet etching is performed on the metal layer film, so as to form a pattern including the source connection layer 10. However, at this time, only the portions of the metal layer film in the active area and in the areas between individual pixel units are removed, while the portion of the metal layer film in the display area Q2 are maintained.

At S0422, as illustrated in FIG. 5, dry etching is performed on the transition layer film, so as to remove the portions of the transition layer film in the active area and in the areas between individual pixel units. Similarly, portions of the transition layer film in other areas are maintained, as these portions are covered by the un-etched metal layer film, and thus will not be etched;

At S0423, as illustrated in FIG. 6, wet etching is performed on portions of the transparent conductive layer film in both the active area and the areas between individual pixel units as well as a portion of the active layer film in areas between individual pixel units, that is, after the wet etching is performed, in the TFT area Q1, the transparent conductive layer film is disconnected at the active area 401, to simultaneously form the source 601 and the drain 602 (the drain 602 is connected to the pixel electrode 8) which are disconnected; respective portions of the transparent conductive layer film and the active layer film in the areas between individual pixel units are removed at the same time, that is, there is no redundant layer existing in the areas between adjacent pixel units.

Figure 7:
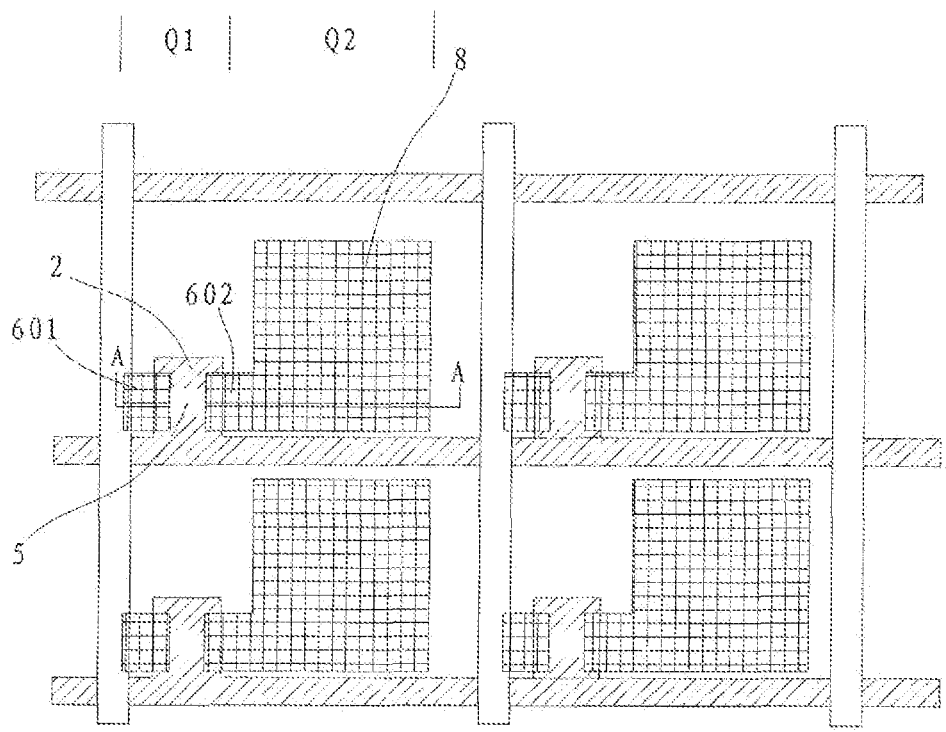
FIG. 7 is a top view of the structure of the array substrate according to Embodiment 2 of the present invention after being formed with a source and a drain.

Specifically, as illustrated in FIG. 7, the array substrate includes a plurality of pixel units, each of which includes the TFT area Q1 and the display area Q2. It should be noted that only the source 601, the drain 602, the gate 2, the pixel electrode 8 and the etching stop layer 5 are illustrated in FIG. 7, while the gate insulation layer 3, the source transition layer 9, the source connection layer 10 and other layers are not illustrated for clarity of the structure, and the person skilled in the art should understand and know the structures and positions of the other layers. It is thus clear that after the step S04, the transparent conductive layer film is disconnected at the active area, the etching stop area 5 is exposed, and the source 601 (in fact, there are the source transition layer 9 and the source connection layer 10 on the source 601, which are not shown) and the drain 602 (FIG. 7 is labeled to show that the drain 602 is directly connected to the pixel electrode 8, but as a matter of fact, the drain 602 is covered by the remaining transition layer film and metal layer film) are formed. Meanwhile, as illustrated in FIG. 7, respective portions of the metal layer film, the transition layer film, the transparent conductive layer film and the active layer film in the areas between individual pixel units are also removed, so that there is no redundant layer existing in the areas between adjacent pixel units. Herein, FIG. 6 is a sectional view of the array substrate according to the present invention illustrated in FIG. 7 along direction A-A.

At S05, a pattern including the pixel electrode 8 is formed from the transparent conductive layer film through a patterning process.

Figure 8:
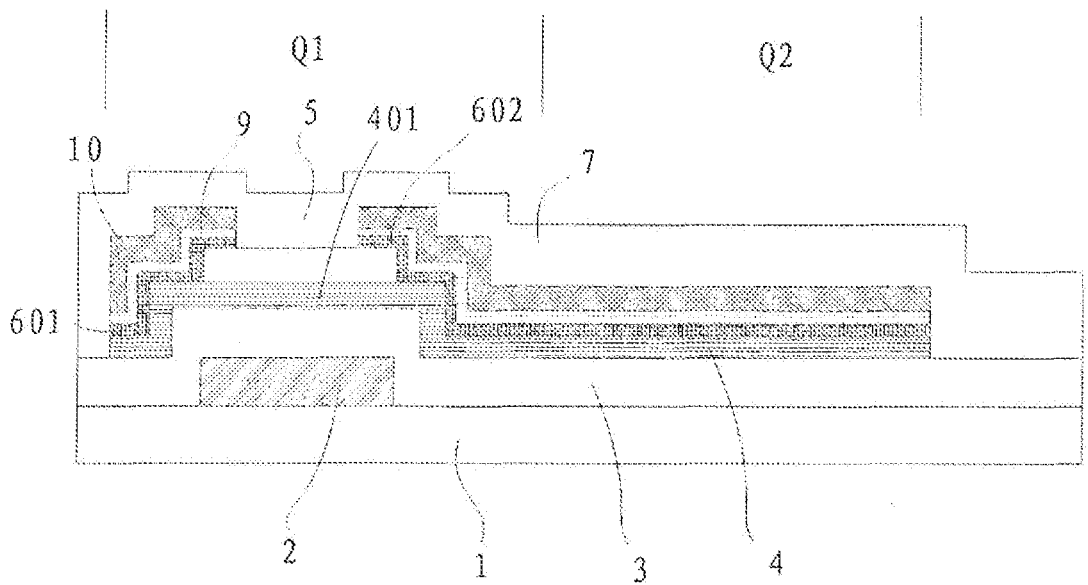
FIG. 8 is a schematic diagram of a structure of the array substrate according to Embodiment 2 of the present invention after being formed with a passivation layer.
Figure 9:
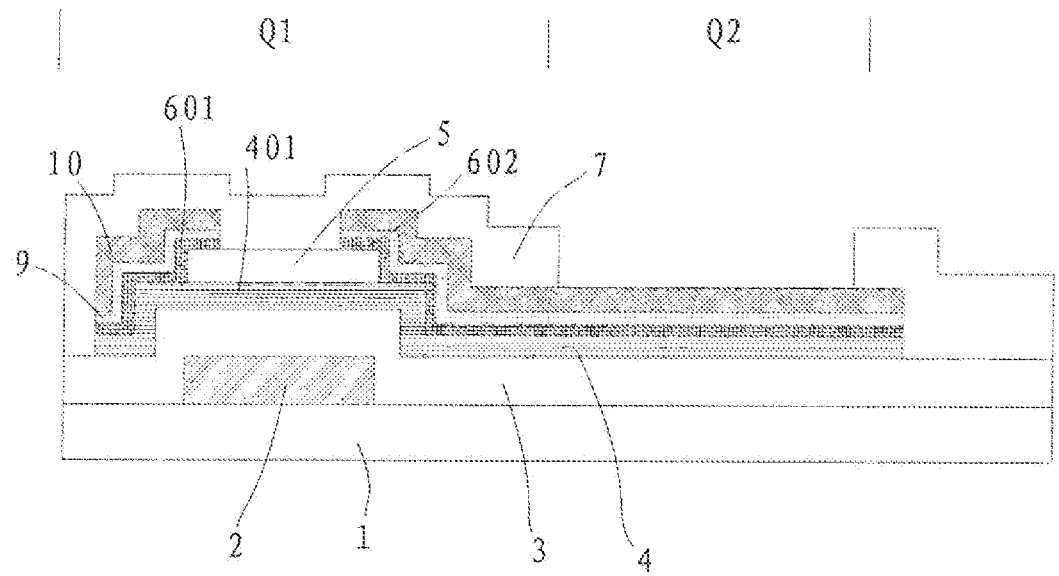
FIG. 9 is a schematic diagram of a structure of the array substrate according to Embodiment 2 of the present invention after being removed of the passivation layer from the display area.
Figure 10:
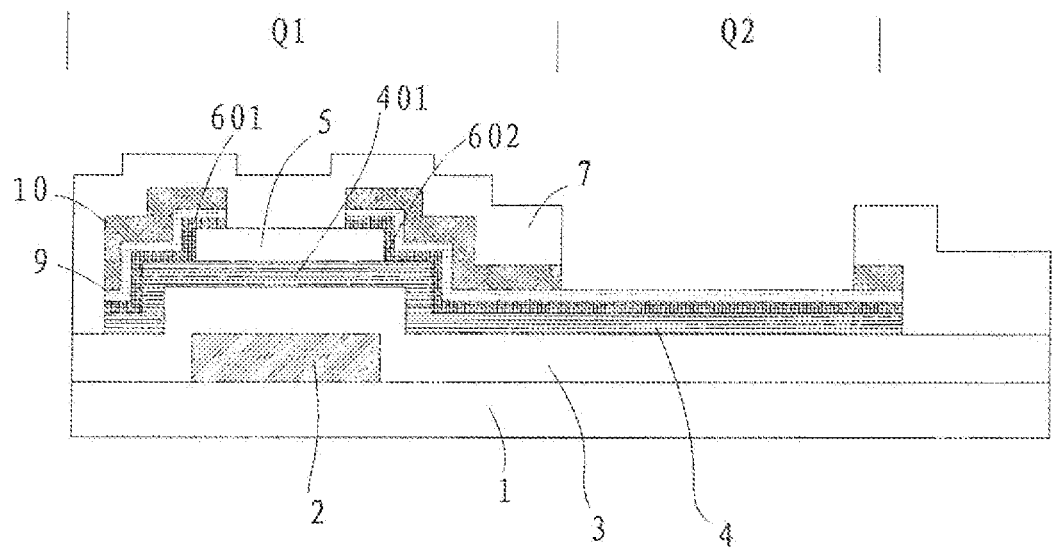
FIG. 10 is a schematic diagram of a structure of the array substrate according to Embodiment 2 of the present invention after being removed of the transition layer film from the display area.

As illustrated in FIGS. 8 to 10, the step SOS preferably includes steps as below.

At S051, as illustrated in FIG. 8, a passivation layer 7 is formed, and a photoresist layer is applied on the passivation layer 7.

Herein, the passivation layer 7 preferably is a multi-layer composite laminate film formed of silicon oxide ($SiO_x$), silicon nitride ($SiN_x$), hafnium oxide ($HfO_x$), silicon nitrogen oxide (SiON), aluminum oxide ($AlO_x$), or two or three materials thereof, and the passivation layer 7 may be prepared by using Plasma Enhanced Chemical Vapor Deposition technique. The passivation layer 7 is characterized by that it contains relatively low hydrogen content and has excellent surface characteristics.

At S052, the photoresist layer is exposed and developed, wherein no photoresist layer is left in the display area Q2.

At S053, as illustrated in FIG. 9, a portion of the passivation layer 7 which is not covered by the photoresist layer in the display area Q2 is removed through dry etching.

As illustrated in FIG. 10, a portion of the metal layer film which is not covered by the photoresist layer in the display area Q2 is removed through wet etching; and a portion of the transition layer film which is not covered by the photoresist layer in the display area Q2 is removed through dry etching, so as to expose the transparent conductive layer film to form a pattern including the pixel electrode 8, i.e., the array substrate illustrated in FIG. 2 is formed; in other words, during the process of forming the pattern including the pixel electrode 8 of this step (SOS), no etching is actually performed on the transparent conductive layer film, and only the passivation layer 7, the metal layer film and the transition layer film are removed from the display area Q2, so that the portion of the transparent conductive layer film in the display area Q2 is exposed to form the pattern including the pixel electrode 8.

At S054, the remaining photoresist layer is removed.

It should be noted that as the transition layer film may be removed through dry etching, the portion of the transparent conductive layer film positioned in the display area 20 may not be impacted when removing the transition layer film. This is because as for the transparent conductive layer film, if the layer disposed thereon needs to be removed through wet etching, the transparent conductive layer film will inevitably be partially removed, whereas if dry etching is adopted, the transparent conductive layer film will not be removed.

It should be further noted that it is also feasible to provide neither transition layer film nor metal layer film in the display area Q2, that is, before the step S05 (step S04), the transition layer film and the metal layer film on the transparent conductive layer film have been removed. Alternatively, neither the T-T area Q1 nor the display area Q2 of the array substrate of this embodiment includes the transition layer film and the metal layer film (in this case, electrical connection between the data line and the source 601 has a poor performance, but the case is still feasible), that is, the passivation layer 7 is on the transparent conductive layer film in the display area Q2, and in this case, the passivation layer 7 may be directly removed through dry etching to form the pixel electrode 8.

In the manufacturing method of the array substrate provided by this embodiment, the source transition layer 9 and the source connection layer 10 are added, but as these two layers are formed in the same patterning process as the source 601 and the drain 602, no additional patterning process is added. Meanwhile, as the source 601, the drain 602 and the pixel electrode 8 on the array substrate of this embodiment are formed from the same transparent conductive layer film, the step of connecting the pixel electrode 8 to the drain 602 through a via in the passivation layer 7 in the prior art is not required. As a result, the manufacturing method of the oxide TFT array substrate which needs six photolithographic processes to respectively form the gate 2, the oxide active layer 4, the etching stop area 5, the source 601 and the drain 602, a via in the passivation layer 7 and the pixel electrode 8 in the prior art is simplified to the manufacturing method of the array substrate which only needs four photolithographic processes. Therefore, the manufacturing process of the present embodiment is relatively simple and the manufacturing costs are relatively low.

Embodiment 3

This embodiment provides a display panel, and the display panel includes the array substrate described in Embodiment 1. The display panel may be a liquid crystal display panel or an OLED display panel.

The display panel of this embodiment has the array substrate in Embodiment 1, and thus has simple manufacturing process and low manufacturing costs.

Embodiment 4

This embodiment provides a display device, and this device includes the display panel described in Embodiment 3. The display device may be any product or component having display function, such as mobile phones, tablet computers, televisions, displays, notebook computers, digital picture frames, navigators, and the like.

The display device of this embodiment has the array substrate in Embodiment 1, and thus has simple manufacturing process and low manufacturing costs.

Of course, the display device of this embodiment may also include other conventional elements, such as power supply unit, display drive unit, and the like.

It should be understand that the above descriptions are merely exemplary embodiments for explaining the principle of the present invention, however, the present invention is not limited thereto. Various variations or improvements may be made without departing from the spirit and substance of the present invention by the person skilled in the art, and these variations and improvements should also be included in the protection scope of the present invention.

The invention claimed is:

1. A manufacturing method of an array substrate, the array substrate including a plurality of pixel units, each of which includes: a thin film transistor (TFT) area provided with a thin film transistor including a gate, a gate insulation layer, a source, a drain and an active area; and a display area provided with a pixel electrode, wherein the manufacturing method of an array substrate includes steps of:
   forming a pattern including the gate on a substrate through a patterning process, and forming the gate insulation layer;
   forming patterns including the active area and an etching stop area provided on the active area through a patterning process, on the substrate subjected to the above step;
   forming a transparent conductive layer film, and forming patterns including the source and the drain from the transparent conductive layer film through a patterning process; and
   forming a pattern including the pixel electrode from the transparent conductive layer film through a patterning process,
   wherein the step of forming a transparent conductive layer film and forming patterns including the source and the drain from the transparent conductive layer film through a patterning process includes steps of:
      sequentially forming the transparent conductive layer film, a transition layer film and a metal layer film; and
      removing respective portions of the metal layer film, the transition layer film and the transparent conductive layer film corresponding to the active area and removing respective portions of the metal layer film, the transition layer film, the transparent conductive layer film and the active layer film between individual pixel units through a patterning process, so as to form patterns including a source connection layer, a source transition layer, the source and the drain,
   wherein, the source transition layer is used to electrically connect the source connection layer with the source,
   wherein the step of forming a pattern including the pixel electrode from the transparent conductive layer film through a patterning process includes steps of:
      forming a passivation layer, and applying a photoresist layer on the passivation layer;
      exposing and developing the photoresist layer, wherein no photoresist layer is left in the display area;
      removing a portion of the passivation layer which is not covered by the photoresist layer in the display area through dry etching;
      removing a portion of the metal layer film which is not covered by the photoresist layer in the display area through wet etching;
      removing a portion of the transition layer film which is not covered by the photoresist layer in the display area through dry etching, so as to expose the transparent conductive layer film to form the pixel electrode; and
      removing the remaining photoresist layer.

2. A manufacturing method of an array substrate, the array substrate including a plurality of pixel units, each of which includes: a thin film transistor (TFT) area provided with a thin film transistor including a gate, a gate insulation layer, a source, a drain and an active area; and a display area provided with a pixel electrode, wherein the manufacturing method of an array substrate includes steps of:
   forming a pattern including the gate on a substrate through a patterning process, and forming the gate insulation layer;
   forming patterns including the active area and an etching stop area provided on the active area through a patterning process, on the substrate subjected to the above step;
   forming a transparent conductive layer film, and forming patterns including the source and the drain from the transparent conductive layer film through a patterning process; and
   forming a pattern including the pixel electrode from the transparent conductive layer film through a patterning process,
   wherein the step of forming patterns including the active area and an etching stop area provided on the active area through a patterning process includes steps of:
      sequentially forming an active layer film and an etching stop layer film, and applying a photoresist layer on the etching stop layer film, wherein, a portion of the active layer film corresponding to the gate constitutes the active area;
      exposing and developing the photoresist layer to maintain a portion of the photoresist layer on the etching stop area;
      removing a portion of the etching stop layer film which is not covered by the photoresist layer to form a pattern of the etching stop area; and
      removing the remaining photoresist layer,
   wherein the step of forming a transparent conductive layer film and forming patterns including the source and the drain from the transparent conductive layer film through a patterning process includes steps of:
      sequentially forming the transparent conductive layer film, a transition layer film and a metal layer film; and
      removing respective portions of the metal layer film, the transition layer film and the transparent conductive layer film corresponding to the active area and removing respective portions of the metal layer film, the transition layer film, the transparent conductive layer film and the active layer film between individual pixel units through a patterning process, so as to form patterns including a source connection layer, a source transition layer, the source and the drain,
   wherein, the source transition layer is used to electrically connect the source connection layer with the source, and wherein the step of forming a pattern including the pixel electrode from the transparent conductive layer film through a patterning process includes steps of:
forming a passivation layer, and applying a photoresist layer on the passivation layer;
exposing and developing the photoresist layer, wherein no photoresist layer is left in the display area;
removing a portion of the passivation layer which is not covered by the photoresist layer in the display area through dry etching;
removing a portion of the metal layer film which is not covered by the photoresist layer in the display area through wet etching;
removing a portion of the transition layer film which is not covered by the photoresist layer in the display area through dry etching, so as to expose the transparent conductive layer film to form the pixel electrode; and
removing the remaining photoresist layer.

* * * * *